United States Patent
Melanson et al.

(10) Patent No.: US 6,529,074 B1
(45) Date of Patent: Mar. 4, 2003

(54) CIRCUITS AND METHODS FOR OUTPUT IMPEDANCE MATCHING IN SWITCHED MODE CIRCUITS

(75) Inventors: John Laurence Melanson, Austin, TX (US); Eric Walburger, Austin, TX (US); Johann Guy Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/917,311

(22) Filed: Jul. 26, 2001

(51) Int. Cl.[7] ............................................... H03F 3/217
(52) U.S. Cl. ................... 330/251; 330/10; 330/207 A; 326/30; 326/82; 326/83
(58) Field of Search ..................... 330/10, 251, 207 A; 326/30, 82, 83, 87; 327/108, 112

(56) References Cited

U.S. PATENT DOCUMENTS

| | | | | |
|---|---|---|---|---|
| 4,764,734 A | * | 8/1988 | Schilling et al. | 330/251 |
| 5,680,060 A | * | 10/1997 | Banniza et al. | 326/30 |
| 5,726,582 A | * | 3/1998 | Hedberg | 326/30 |
| 6,294,954 B1 | * | 9/2001 | Melanson | 330/10 |

* cited by examiner

Primary Examiner—Tuan T. Lam
(74) Attorney, Agent, or Firm—James J. Murphy; Winstead Sechrest & Minick

(57) ABSTRACT

An output stage 300 includes a first output switch 201 having a current path for driving an output from a first voltage rail and a second output switch 202 having a current path for selectively driving the output from a second voltage rail. A first reference switch 301 is scaled with respects to first output switch 201 and has a current path coupled to the first voltage rail. A second reference switch 302 scaled with respects to second output switch 202 has a current path coupled to a current path of first reference switch 301 at a node and the second voltage rail. The logic measures an impedance mismatch between first and second reference switches 301, 302 and proportionally varies the impedance of a selected one of first and second output switches 201, 202 in response.

24 Claims, 3 Drawing Sheets

CIRCUITS AND METHODS FOR OUTPUT IMPEDANCE MATCHING IN SWITCHED MODE CIRCUITS

BACKGROUND OF THE INVENTION

1. Field of the Invention

The present invention relates in general to switched mode electronic circuits and in particular to circuits and methods for output impedance matching in switched mode circuits.

2. Description of the Related Art

Class D audio power amplifiers (APAs) have been used for many years in systems, such wireline telephony, where high bandwidth is not critical. More recently however, new fabrication techniques, and in particular, new techniques for fabricating power transistors, have made integrated Class D APAs possible. This has extended their potential applications to lower-power, higher-bandwidth systems, including battery-powered portable music players and wireless communications devices.

One major advantage of Class D amplifiers is their efficiency. Generally, an audio signal is converted into a relatively high frequency stream of pulses varying in width with the amplitude of the audio signal. This pulse width modulated (PWM) signal is used to switch a set of power output transistors between cutoff and saturation which results in efficiencies above 90%. In contrast, the typical Class AB push-pull amplifier, using output transistors whose conduction varies linearly during each half-cycle, has an efficiency of around 60%. The increased efficiency of Class D amplifiers in turn reduces power consumption and consequently lowers heat dissipation and improves battery life.

Given the importance of improved battery-life, reduced heat dissipation, and component size minimization in the design and construction of portable electronic appliances, improved switched mode techniques will have numerous practical advantages. The possible applications for these techniques are numerous, although Class D APAs are one of the primary areas which should be considered.

SUMMARY OF THE INVENTION

According to one embodiment of the principles of the present invention, a switched mode output stage is disclosed which includes first and second output transistors for respectively driving an output terminal from the first and second voltage rails in response to a driving signal and a complement of the driving signal. First and second reference transistors are included having current paths coupled in series at a node and selectively coupling the first and second voltage rails, the reference transistors scaled with respect to the first and second output transistors. Measurement and control logic includes circuitry for sensing an imbalance between a voltage appearing at the node and a reference voltage and feeding back a control signal to a gate of a selected one of the reference transistors to compensate for the imbalance. Additional circuitry varies and impedance of a selected one of the first and second output transistors in response to the control signal.

Circuits and methods embodying the inventive concepts advantageously provide means for matching output impedance. Among other things, these techniques can be used in switched mode circuits, such as switched mode amplifiers, and similar circuitry. Implementing the inventive principles is efficient, from both a cost and circuit performance point of view.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The principles of the present invention and their advantages are best understood by referring to the illustrated embodiment depicted in FIGS. 1–6 of the drawings, in which like numbers designate like parts.

Figure 1:
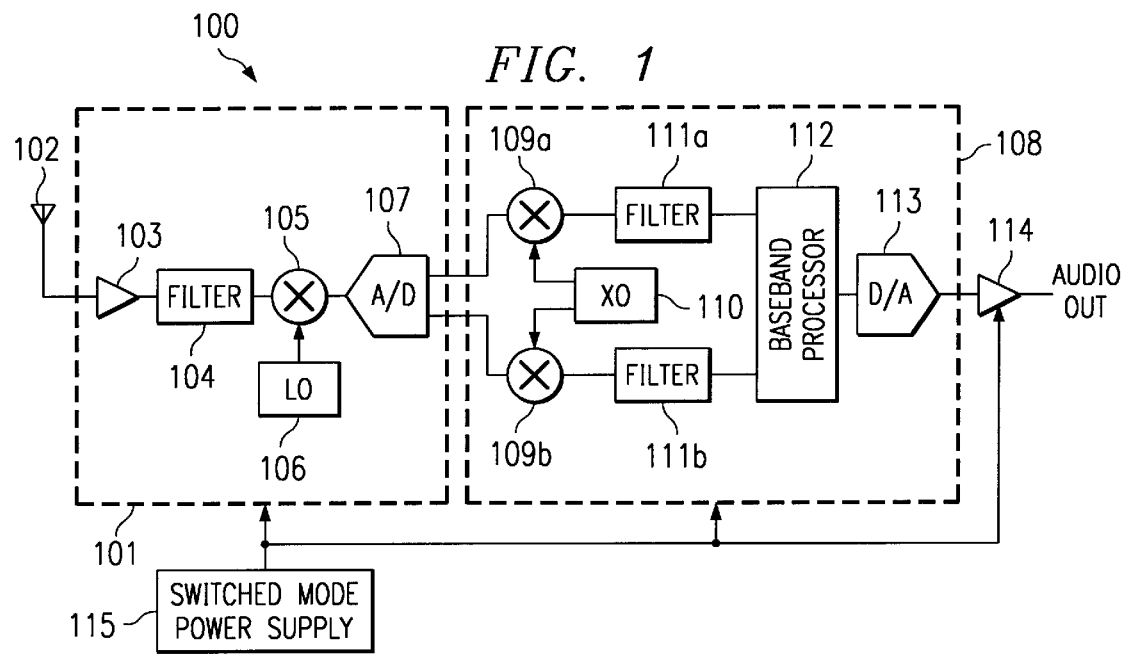
FIG. 1 is a diagram of one channel of a digital radio embodying the principles of the present invention.

FIG. 1 is a functional block diagram of one channel of a digital radio 100 embodying the principles of the present invention. Digital radio 100 includes an analog section or front-end 101 which receives radio frequency (RF) signals from an associated antenna 102. Analog front-end 101 is preferably a conventional RF down-converter including a low noise amplifier (LNA) 103 for setting the system noise figure, a bandpass filter 104 and mixer 105 driven by an analog local oscillator 106. The mixed-down analog signal is then converted into digital form by analog to digital converter 107.

The digitized data output from A/D converter 107 is passed to digital processing section 108. A pair of mixers 109a,b generate in-phase (I) and quadrature (Q) signals from a corresponding pair of clock phases from crystal oscillator 110. The I and Q signals are next passed through bandpass filters 111a and 111b and on to digital baseband processor 112. The processed digital signal is then re-converted to analog (audio) form by D/A converter 113. The associated headset or speakers are driven in this example by APA 114.

Figure 2:
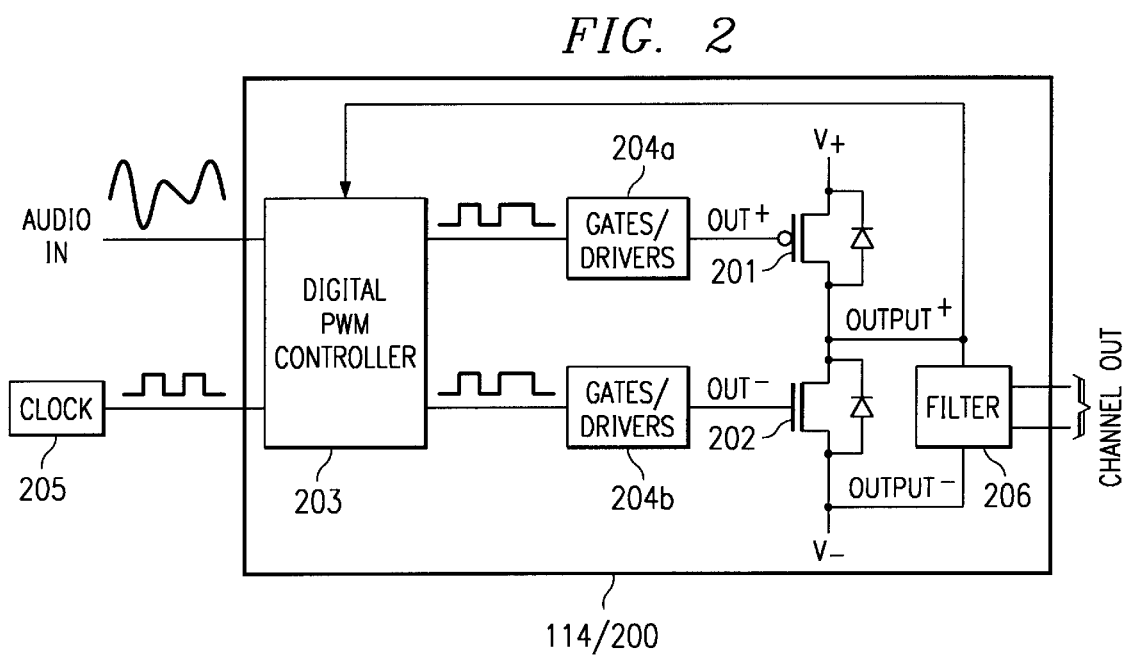
FIG. 2 is a diagram of a Class D pulse width modulated (PWM) amplifier suitable for use as audio power amplifier in the system of FIG. 1.

FIG. 2 is a schematic diagram of a typical Class D, PWM amplifier 200 suitable for use as amplifier 114 in digital radio 100 and similar application. It should be recognized that the depicted configuration of amplifier 200 is exemplary, and the inventive principles discussed further below can be applied to alternate amplifier configurations equally as well.

In the illustrate amplifier 200, the output stage consists of a p-channel MOS (PMOS) transistor 201 driving the output OUTPUT+ from the high voltage rail V+ and a complementary n-channel MOS (NMOS)transistor 202 driving OUTPUT+ from the low voltage rail V−. The gates of Hi transistors 201 and 202 are in turn driven by a commercially available PWM controller 203, along with gates/drivers 204a,b. In the case of an audio application, PWM controller 203 receives the input AUDIO IN along with a clock from a clock generator 205. The output includes a low-pass filter 206, which can be of any one of a number well-known designs (e.g. an L-C filter).

One of the problems which can develop in switched-mode circuit designs, such as amplifier 200, is output resistance imbalance. In this case, the high switch is implemented with a PMOS transistor 201 and the low switch with a NMOS transistor 202. Conventional circuit drivers 204 drive the gates of transistors 201,202, with PMOS transistor 201 turning on when its gate is pulled-down nominally to the low voltage rail V− and NMOS transistor 202 turning on when its gate is pulled-up nominally to the high voltage rail V+.

Transistors 201 and 202 are matched as closely as possible in size based on their specification parameters, with the PMOS device typically 2 to 3 times as large as the NMOS device. If the actual devices conform to their respective specifications, the matching minimizes distortion due to mismatch effects. However, in practice these transistors will have strengths which deviate significantly from their specification values. This is a result in changes in device parameters such as threshold voltage, for example. Moreover, the transistor characteristics vary over temperature, voltage and time, compounding the mismatch problem.

The mismatch between transistors 201 and 202 typically manifests itself as a resistance unbalance which distorts the output signal. This can be viewed as a non-constant output impedance which is a function of the output voltage level. The output impedance is approximately $r1*(x+r2)*(1-x)$, where x is the duty cycle of the switching transistor 201, (1−x) is the duty cycle of transistor 202, and r1 and r2 are the respective resistances on the two switching transistors. (All values are approximate since the response of the switching transistors is not instantaneous).

It is possible to reduce the effects of mismatch by selecting transistors with a much lower impedance than necessary. This alternative however negatively impacts both cost and circuit efficiency. The present inventive concepts address this problem in a more cost effective and performance efficient manner.

Figure 3:
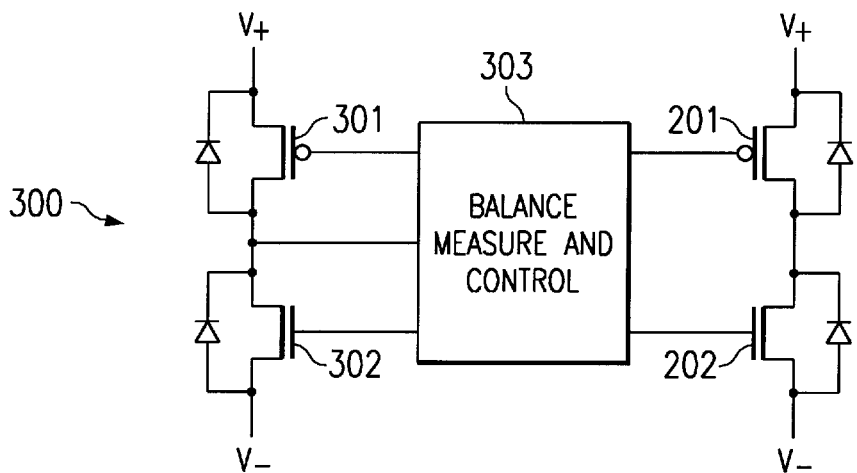
FIG. 3 depicts a switched-mode output stage which includes a pair of reference switches (transistors) corresponding to output switches (transistors0.

FIG. 3 depicts a switched-mode output stage 300 which includes a pair of reference switches (transistors) 301 corresponding to output switches (transistors) 201 and 202 respectively. Reference switches 301 and 302 are down scaled with respects to output switches 201 and 202, for example by a factor of 1000, but are otherwise equivalent in all other respects. (Both reference switches 301,302 are in the same ratio to the matching output switches 201,202).

Balance Measure and Control Logic 303 is coupled to reference transistors 301 and 302, as well as output transistors 201 and 202. Logic 303 measures the balance between reference switches 301 and 302 and in response generates the control signals necessary to match the impedance of reference switches 301 and 302. These same control signals are also applied to output transistors 201 and 202. Since the output transistors 201,202 are proportioned with respects to the reference transistors 301, 302, the net result is matching of the impedance of output transistor 201 with the impedance of output transistor 202 to a good approximation.

There are a number of ways to implement Balance Measure and Control Logic 303, two of which will be discussed with reference to FIGS. 4, 5, and 6.

Figure 4:
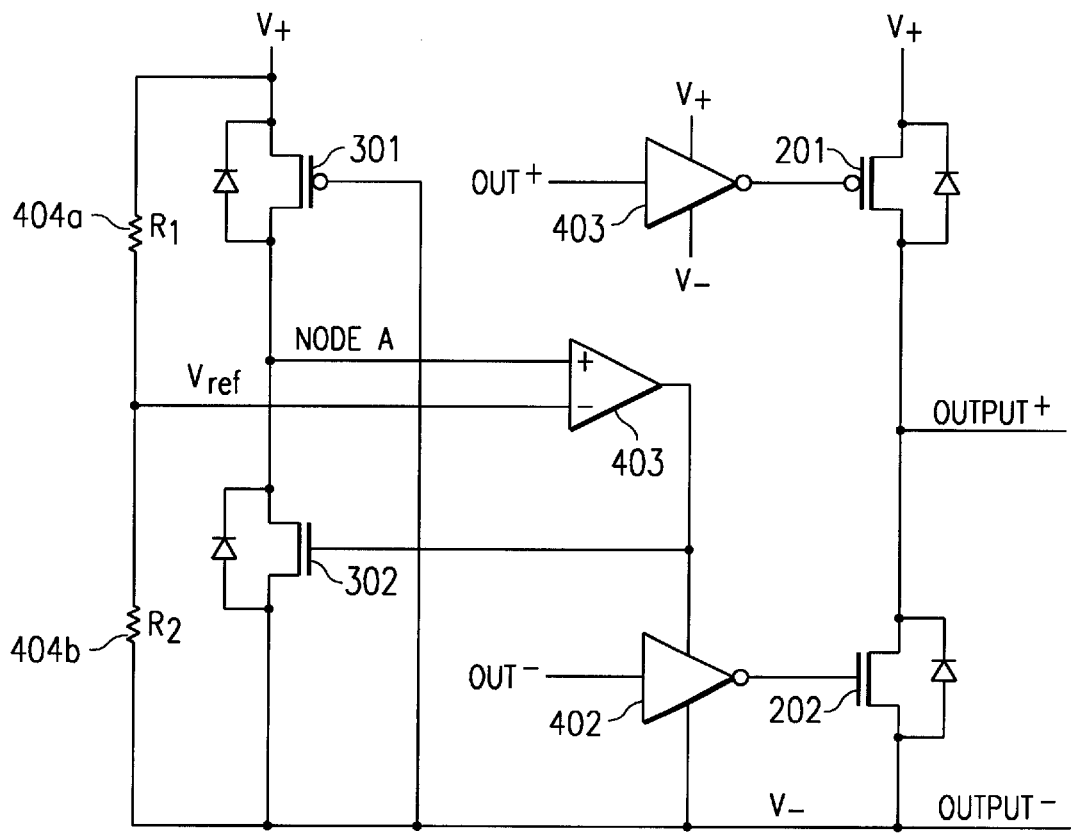
FIG. 4 depicts a circuit in which, PMOS output transistor is driven by a driver operating between the high voltage rail V+ and the low voltage rail V−.

In the circuit of FIG. 4, PMOS output transistor 201 is driven by a driver 403a operating between the high voltage rail V+ and the low voltage rail V−. NMOS output transistor 202 also driven by a driver 402, however, driver 402 operates between a supply voltage provided by a differential amplifier 403 and the low voltage rail V−.

Differential amplifier 402 senses the voltage difference between Node A, at the common source/drain connection of reference transistors 301 and 302, and a reference voltage Vref. In the illustrated circuit, Vref is generated by a voltage divider comprised of resistors 402a (R1) and 402b (R2), and is set nominally at ½ the supply voltage (V+−V−). The voltage output from differential amplifier 403 feeds back to the gate of reference transistor 302 and adjusts the gate voltage of reference transistor 302 until its impedance matches that of reference transistor 301 (i.e., the voltage difference between the inputs of differential amplifier 403 is approximately 0). When the impedance of reference transistors 301,302 matches, the impedance of output transistors 201,202 will also match, since the differential amplifier output also varies the voltage at the gate of NMOS output transistor 202 through driver 402. Specifically, the peak drive to the gate of transistor 202 is varied as a function of the supply voltage to driver 402, which in turn changes the voltage swing at the output.

It should be noted that in the illustrated embodiment, impedance matching is implemented by varying the gate voltage at NMOS output transistor 202, while the gate voltage at PMOS output transistor 201 is kept constant. This choice is preferred since the PMOS transistor is much larger physically than the NMOS transistor. Enlarging the NMOS transistor to allow for the variable drive voltage is therefore more economical. Notwithstanding, impedance matching can also be implemented by varying the PMOS gate voltage or the gate voltage to both the PMOS and NMOS output transistors.

Figure 5:
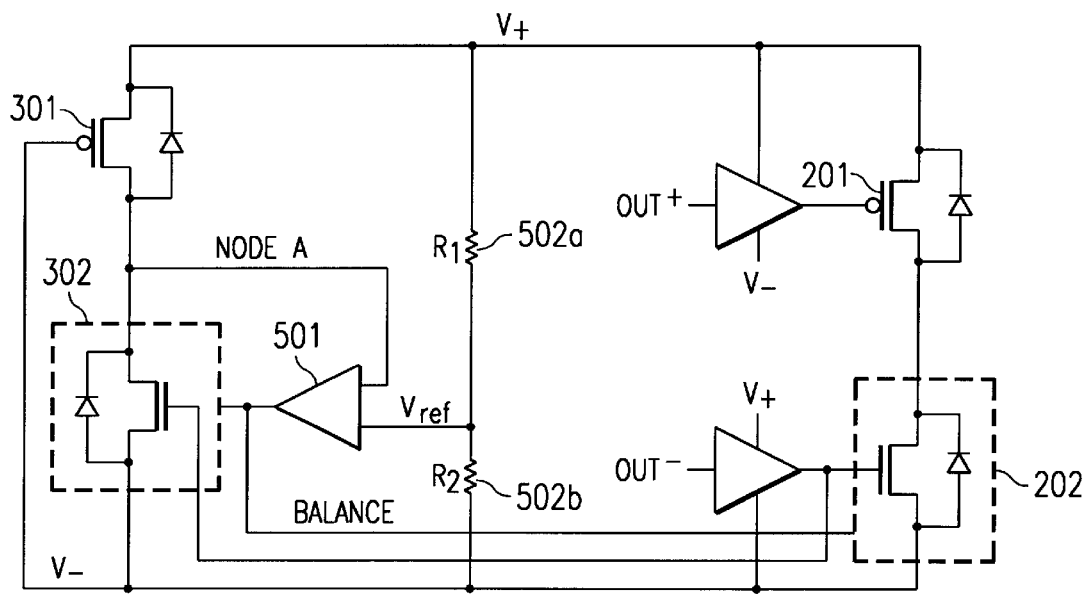
FIG. 5 depicts another way to implement Balance Measure and Control Logic.
Figure 6:
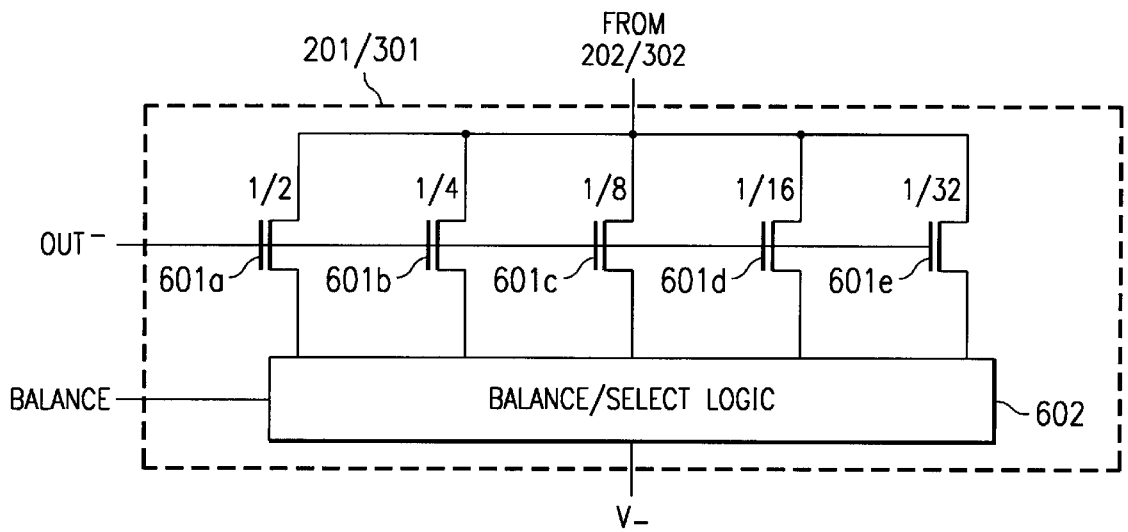
FIG. 6 depicts yet another way to implement balance Measure and Control Logic.

A second possible output impedance matching technique is illustrated in FIGS. 5 and 6. In this instance, NMOS output transistor 202 and NMOS reference transistor 302 are each constructed from a set of smaller, scaled NMOS sub-transistors 601a,e. Here, the relative scaling is in steps of ⅓₂, from ⅓₂ to ½, although the actual scaling, as well as the number of transistors (segments) 601, may vary from implementation to implementation, depending on the specific design.

Differential amplifier 501 measures the voltage at Node A against reference voltage Vref (provided by a voltage divider composed of resistors 502a and 502b) to determine imbalance. The signal BALANCE is then used as feedback compound reference transistor 302 to switch on the appropriate number of sub-transistors 601 to balance the voltage at the inputs to differential amplifier 501. BALANCE also switches on the corresponding number of sub-transistors in compound output transistor 202. As a result, the impedance between output transistors 201 and 202 is balanced.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. A output stage comprising:
   a first output switch having a current path for driving an output from a first voltage rail;
   a second output switch having a current path for selectively driving the output from a second voltage rail;
   a first reference switch scaled with respect to the first output switch and having a current path coupled to the first voltage rail;
   a second reference switch scaled with respects to the second output switch having a current path coupled to a current path of the first reference switch at a node and the second voltage rail; and
   logic for measuring an impedance mismatch between the first and second reference switches and proportionally varying the impedance of a selected one of the first and second output switches in response.

2. The output stage of claim 1 wherein the logic comprises:
   a differential amplifier having inputs for comparing a reference voltage and a voltage at the node and an output coupled to the control terminal of the second reference switch for balancing the reference voltage and the voltage at the node; and
   a driver operating from a supply voltage provided from the output of the differential amplifier and having an output driving a control terminal of the selected one of the output switches.

3. The output driver of claim 1 wherein the second output switch and the second reference switch each comprise a plurality of parallel sub-switches, and the logic comprises:
   a differential amplifier having inputs for comparing a reference voltage and a voltage at the node and an output coupled to the control terminal of the second reference switch; and
   logic for selectively activating one of the sub-switches of the second reference switch to balance the voltages at the inputs of the differential amplifier and selectively activating a corresponding ones of the sub-switches of the second output switch.

4. The output stage of claim 1 wherein the first and second output switches comprise field effect transistors.

5. The output stage of claim 1 wherein the first output switch comprises a p-channel transistor and the second output switch comprises a n-channel transistor.

6. The output stage of claim 1 wherein the first and second reference switches comprise field effect transistors.

7. A switched-mode output stage comprising:
   first and second output transistors for respectively driving an output terminal from first and second voltage rails in response to a driving signal and a complement of the driving signal;
   first and second reference transistors having current paths coupled in series at a node and selectively coupling the first and second voltage rails, said reference transistors scaled with respects to said first and second output transistors; and
   measurement and control logic comprising:
      circuitry for sensing an imbalance between a voltage appearing at said node and a reference voltage and feeding back a control signal to a gate of a selected one of the reference transistors to compensate for the imbalance; and
      circuitry for varying an impedance of a selected one of the first and second output transistors in response to said control signal.

8. The output stage of claim 7 wherein said circuitry for sensing comprises an differential amplifier having complementary inputs coupled to a source of said reference voltage and said node.

9. The output stage of claim 7 wherein said circuitry for varying comprises a driver controlled by said control signal and driving a gate of said selected one of the output transistors.

10. The output stage of claim 7 wherein the selected one of the output transistors comprises a plurality of parallel sub-transistors and said circuitry for varying is operable to activate a selected number of said sub-transistors to vary the output impedance of said selected one of the output transistors.

11. The output stage of claim 7 wherein said first output transistor comprises a p-channel transistor having a gate driven by said driving signal and the second output transistor comprises an n-channel having a gate driven by a said complement of said driving signal.

12. The output stage of claim 11 wherein the first voltage rail comprises a high voltage rail and the second voltage rail comprises a low voltage rail.

13. The output stage of claim 11 wherein the first reference transistor comprises a p-channel transistor having a current path coupled to said first voltage rail and said second reference transistor comprises an n-channel transistor having a current path coupled to said second voltage rail.

14. The output stage of claim 13 wherein a gate of said p-channel transistor is coupled to said second voltage rail.

15. An amplifier comprising:
   driving circuitry for generating at least one driving signal; and
   a switched-mode output stage comprising:
      a set of output transistors for driving an amplifier output from a set of voltage rails in response to the at least one driving signal;
      a set of reference transistors scaled with respects to the output transistors and operating from the set of voltage rails;
      sensing circuitry for sensing an imbalance between the set of reference transistors and generating a control signal; and
      balancing circuitry for matching impedances of the set of output transistors in response to the control signal.

16. The amplifier of claim 15 wherein the at least one driving signal comprises a pulse width modulated signal.

17. The amplifier of claim 16 wherein the driving circuitry comprises a controller generating the pulse width modulated signal from received analog and clock signals.

18. The amplifier of claim 15 wherein the switched-mode stage forms a portion of an audio power amplifier.

19. The amplifier of claim 15 wherein the set of output transistors of the switched-mode output stage comprises:
   a first output field effect transistor of a first type for driving the output from a high voltage rail; and
   a second output field effect transistor of a second type and driving the output from a low voltage rail.

20. The amplifier of claim 19 wherein the set of reference transistors of the switched-mode output stage comprises:
   first reference field effect transistor of the first type and scaled with respects to the first output transistor and having a current path coupled to the high voltage rail; and a second reference field effect transistor of the second type and having a current path coupled to a current path of the first reference transistor at a node and the low voltage rail.

21. Amplifier of claim 20 wherein the transistors of the first type of the sets of output and reference transistors of the switched-mode output stage comprise PMOS transistors and the transistors of the second type of the sets of output and reference transistors of the switched-mode output stage comprise NMOS transistors.

22. The amplifier of claim 15 wherein the sensing circuitry comprises a differential amplifier.

23. The amplifier of claim 15 wherein the balancing circuitry comprises a driver having an output voltage controlled by the control signal generated by the sensing circuitry.

24. The amplifier of claim 15 wherein the balancing circuitry comprises a plurality of transistors disposed in parallel and selectively activated in response to the control signal.

* * * * *